United States Patent
Besser et al.

(10) Patent No.: US 6,773,978 B1
(45) Date of Patent: Aug. 10, 2004

(54) METHODS FOR IMPROVED METAL GATE FABRICATION

(75) Inventors: Paul Raymond Besser, Sunnyvale, CA (US); Eric Paton, Morgan Hill, CA (US); James Pan, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 13 days.

(21) Appl. No.: 10/229,690

(22) Filed: Aug. 28, 2002

Related U.S. Application Data
(60) Provisional application No. 60/397,825, filed on Jul. 23, 2002.

(51) Int. Cl.⁷ .......................................... H01L 21/8242
(52) U.S. Cl. ........................ 438/238; 438/257; 438/210; 438/275; 438/224; 438/229; 438/231; 438/286; 438/305; 438/346; 438/301; 257/407; 257/408; 257/757
(58) Field of Search ................................ 438/238, 257, 438/210, 275, 224, 229, 231, 286, 305, 346, 301; 257/407, 408, 757

(56) References Cited

U.S. PATENT DOCUMENTS

| | | | |
|---|---|---|---|
| 4,912,061 A | * | 3/1990 | Nasr ........................... 438/231 |
| 4,997,779 A | | 3/1991 | Kohno |
| 5,937,315 A | | 8/1999 | Xiang et al. |
| 6,096,595 A | * | 8/2000 | Huang ........................ 438/238 |
| 6,100,145 A | | 8/2000 | Kepler et al. |
| 6,140,167 A | | 10/2000 | Gardner et al. |
| 6,265,749 B1 | | 7/2001 | Gardner et al. |
| 6,268,255 B1 | | 7/2001 | Besser et al. |
| 6,274,511 B1 | | 8/2001 | Wieczorek et al. |
| 6,326,251 B1 | | 12/2001 | Gardner et al. |
| 6,329,277 B1 | | 12/2001 | Liu et al. |
| 6,342,414 B1 | | 1/2002 | Xiang et al. |
| 6,368,950 B1 | | 4/2002 | Xiang et al. |
| 6,372,673 B1 | | 4/2002 | Besser et al. |
| 6,376,343 B1 | | 4/2002 | Buynoski et al. |
| 6,380,057 B1 | | 4/2002 | Buynoski et al. |
| 6,387,767 B1 | | 5/2002 | Besser et al. |
| 6,391,750 B1 | | 5/2002 | Chen et al. |
| 6,410,967 B1 | | 6/2002 | Hause et al. |
| 6,534,837 B1 | * | 3/2003 | Bai et al. ..................... 257/407 |

* cited by examiner

*Primary Examiner*—Victor V Yevsikov (57) ABSTRACT

Methods are disclosed for manufacturing semiconductor devices with silicide metal gates, wherein a single-step anneal is used to react a metal such as cobalt or nickel with substantially all of a polysilicon gate structure while source/drain regions are covered. A second phase conductive metal silicide is formed consuming substantially all of the polysilicon and providing a substantially uniform work function at the silicide/gate oxide interface.

5 Claims, 7 Drawing Sheets

METHODS FOR IMPROVED METAL GATE FABRICATION

REFERENCE TO RELATED APPLICATION

This application claims the benefit of U.S. Provisional Patent Application Ser. No. 60/397,825, which was filed Jul. 23, 2002, entitled METHODS FOR IMPROVED METAL GATE FABRICATION.

FIELD OF INVENTION

The present invention relates generally to semiconductor device processing and more particularly to methods for fabricating metal transistor gates in the manufacture of semiconductor devices.

BACKGROUND OF THE INVENTION

Figure 1A:
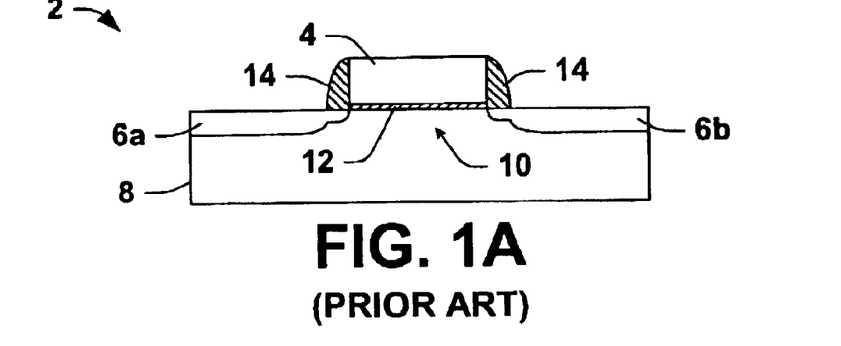
FIGS. 1A–1F are partial side elevation views in section illustrating a conventional three step salicide process for forming silicide gate, source, and drain contacts in a semiconductor device.

In the manufacture of semiconductor products, individual transistors and other electrical devices are formed on or in a semiconductor substrate, and are thereafter interconnected to form circuits. Electrical connections are typically made to transistor gate and source/drain terminals by forming silicide contacts thereover. Interlayer dielectric (ILD) material is then formed over the wafer, through which vias are etched and filled with conductive material (e.g., tungsten, copper, or the like) to provide electrical connection to the gate and source/drain silicide contacts. Interconnection of the various devices is then accomplished by forming a multi-level interconnect network in layers formed over the electrical devices, by which the device active elements are connected to other devices to create the desired circuits in the finished integrated circuit Referring to FIGS. 1A–1F, the formation of silicide contacts in many transistor fabrication processes is done simultaneously for a polysilicon gate 4 and the source/drain regions 6a and 6b of a MOS type transistor 2 fabricated in a substrate 8, using a self-aligned silicide process (salicide). The source/drain regions 6a and 6b are laterally spaced in the substrate 8 to define a channel region 10 in the substrate 8, over which a thin gate oxide 12 is formed. The polysilicon gate structure 4 is formed over the gate oxide 12 and sidewall spacers 14 are formed on the lateral sides of the gate 4 and gate oxide 12, wherein the source/drain regions 6a and 6b are provided with dopants in one or more process steps to provide the structure of FIG. 1A.

Figure 1B:
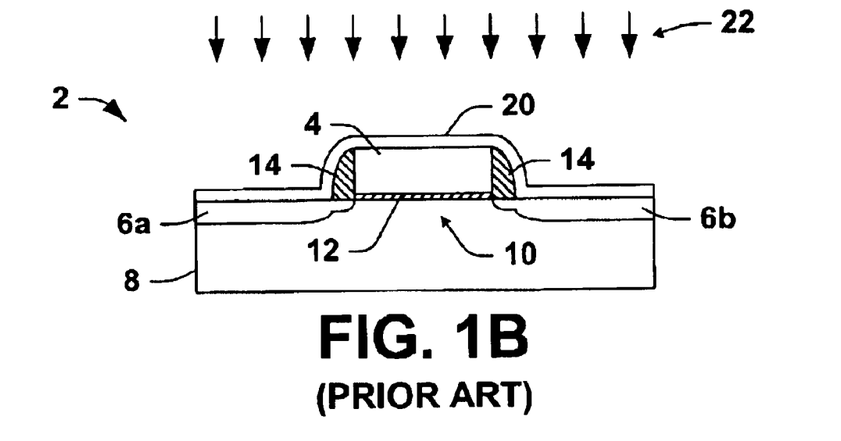
Figure 1C:
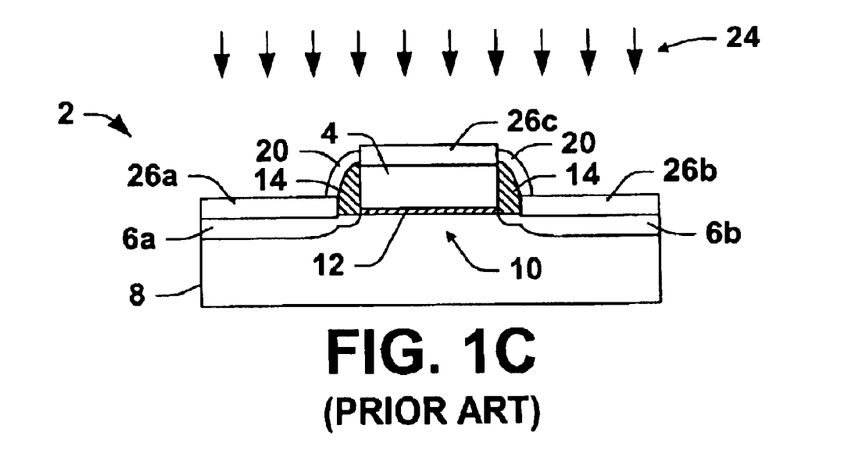

A nickel (Ni) layer 20 is then formed over the device 2 in FIG. 1B by a deposition process 22. In FIG. 1C, a first thermal process 24 is employed to react the upper portions of the gate polysilicon 4 and the source drain substrate regions 6a, 6b with the nickel 20. The first thermal process is typically performed at a relatively low temperature, such as below 500 degrees C. This results in formation of first phase nickel silicide ($Ni_2Si+NiSi$) contacts 26a and 26b over the source/drains 6a and 6b, respectively, as well as a first phase nickel silicide $Ni_2Si$ contact 26c over the remaining (e.g. non-consumed) polysilicon gate 4.

Figure 1D:
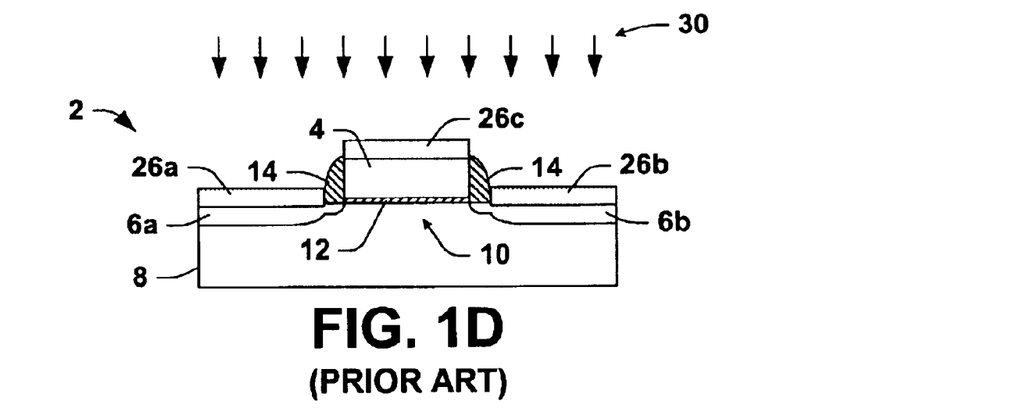
Figure 1E:
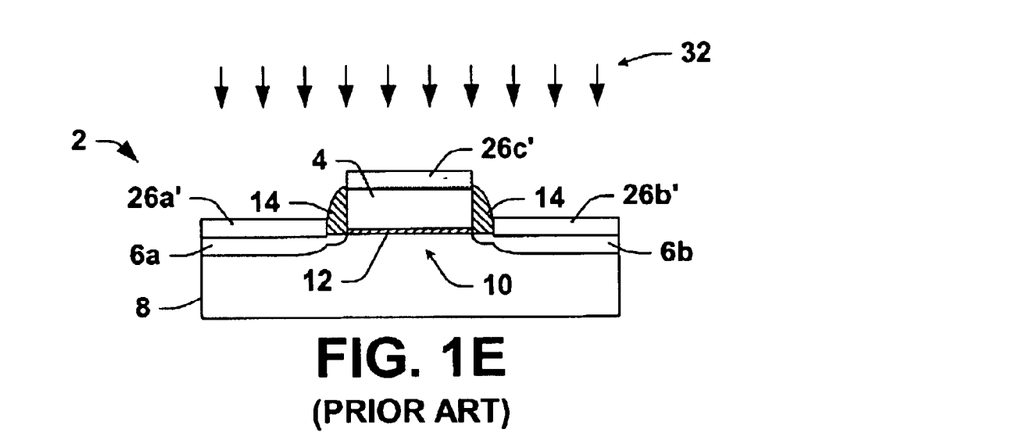
Figure 1F:
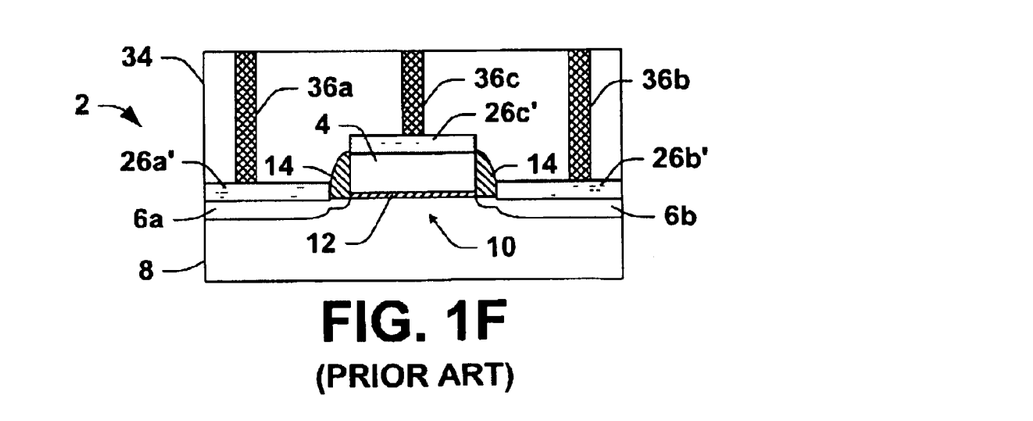

An etch process 30 is performed in FIG. 1D to remove the remaining unreacted nickel 20 and a second thermal process 32 is employed in FIG. 1E to transform the first phase nickel silicide $Ni_2Si+NiSi$ contacts 26a–26c into second phase nickel silicide NiSi contacts 26a'–26c', where the second phase silicide NiSi contacts 26a'–26c' are of lower resistance than the first phase silicide $Ni_2Si$ 26a–26c. Interconnect layers are then formed over the device 2, as illustrated in FIG. 1F, including ILD dielectric material 34 and conductive contacts 36a–36c formed in vias to make connection with the silicide contacts 26a'–26c', respectively. The resulting structure of FIGS. 1E and 1D provides a gate consisting of the phase two silicide 26c', the polysilicon 4, and the gate oxide 12 overlying the channel region 10 of the substrate 8.

However, as device sizes continue to be scaled, and as device performance continues to be improved, it is desirable to reduce the work function of transistor gates. The work function represents the energy required to move an electron in a solid atom from the Fermi level to the vacuum level outside of the atom, and is used to compare the energy states of various elements and to predict electrical properties of the contact between them. The work function of the gate of the transistor 2 is based on silicon-oxide-silicon interfaces, corresponding to the interfaces between the polysilicon 4, the gate oxide 12, and the silicon channel 10. Thus, there is a need for improved techniques for processing transistor gates by which reduced gate work functions can be achieved.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, the primary purpose of this summary is to present some concepts of the invention in a simplified form as a prelude to the more detailed description that is presented later.

One aspect of the invention involves methods for silicide metal gate formation in which a single thermal process is used to react gate polysilicon with and overlying metal layer to form a conductive second phase metal silicide gate extending from the bottom surface to the top surface, which consumes substantially all the polysilicon. The process is performed as a separate silicide for the transistor gate only, wherein the source/drain regions may be covered during the single-step thermal gate silicide process, and a separate source/drain region silicide: process is employed to provide silicide source/drain contacts. In one implementation of the invention, a single rapid thermal anneal (RTA is used at about 500 degrees C. or more to react the metal layer nickel or cobalt with polysilicon to form phase two silicide material (e.g., NiSi or $CoSi_2$) in a single thermal step, in which little or no interface roughness is found at the silicide/gate oxide interface. Thus, the invention facilitates adjustment and control of the gate work function by reducing the non-uniformity thereof. This, in turn provides the advantages of silicide metal gates without the transistor gate work function non-uniformities found in prior devices.

To the accomplishment of the foregoing and related ends, the following description and annexed drawings set forth in detail certain illustrative aspects and implementations of the invention. These are indicative of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

One or more implementations of the present invention will now be described with reference to the drawings, wherein like reference numerals are used to refer to like elements throughout, and wherein the various structures are not necessarily drawn to scale. The present invention relates to methods for siliciding a polysilicon gate in a semiconductor wafer, wherein a single thermal step, such as rapid thermal annealing (RTA) is used at a relatively high temperature to react substantially all the gate structure polysilicon with a metal layer to form a conductive second phase metal silicide gate with a substantially uniform work function. Toward the end of reducing the gate work function, metal gate technology is becoming attractive to provide a gate work function lower than that possible using a polysilicon gate with a thin overlying silicide contact. In addition, metal silicide gates may be employed to eliminate polysilicon depletion effects and the associated degradation in transistor performance found in devices such as that of FIG. 1F. Thus, the inventors have appreciated that silicide metal gates may be fabricated, where polysilicon gate structures are formed and reacted with refractive metals to form a gate consisting of metal silicide directly overlying the gate oxide, ideally having little or no remaining polysilicon.

FIGS. 2A–2F illustrate one such silicide metal gate transistor 52 being formed in a substrate 58, wherein instead of having silicon-oxide-silicon for the gate work function, a metal silicide-oxide-silicon work function is desired. The device 52 is processed using a three-step silicide process using a first RTA at a relatively low temperature, followed by an etch to remove unreacted metal, and a second RTA at higher a temperature to transform the silicide into lower resistance second phase silicide material. Initially, source/drain regions 56a and 56b are formed in the substrate 58 on either side of a channel region 60, above which a gate oxide 62 and a polysilicon gate structure 54 are fabricated.

Figure 2A:
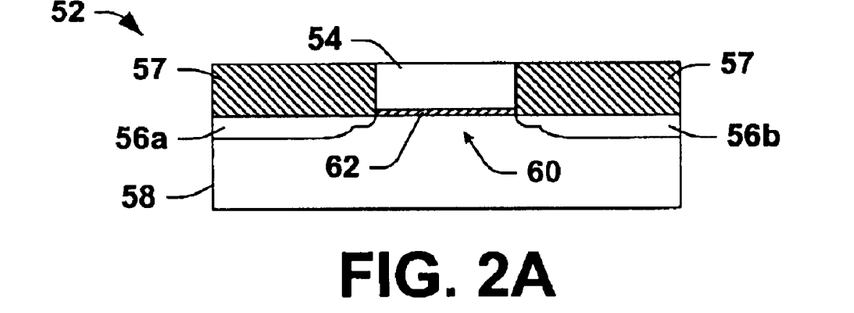
FIGS. 2A–2F are partial side elevation views in section illustrating a three step process for fabricating a metal silicide gate in a semiconductor device.
Figure 2B:
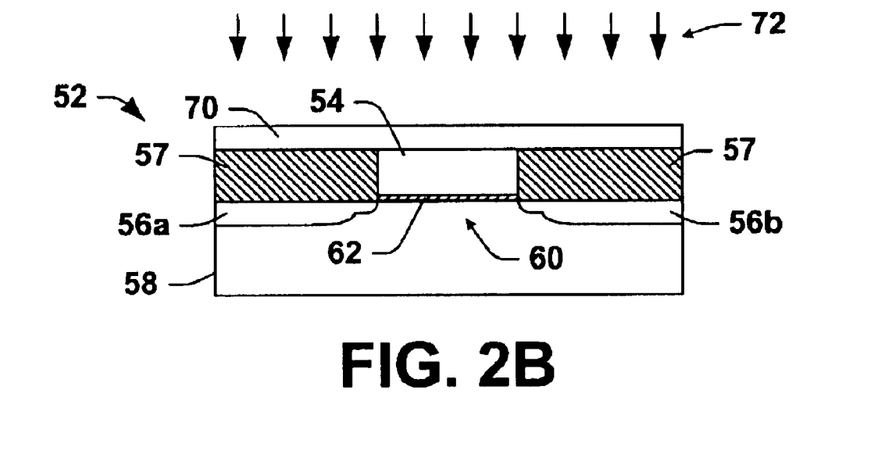

The source drain regions 56a and 56b are covered with a layer 57 of nitride or other material as shown in FIG. 2A and a nickel layer 70 is formed over the device 52 in FIG. 2B via a deposition process 72. A first thermal process 74 is employed in FIG. 2C to react the gate polysilicon 54 with the nickel 70, resulting in formation of a first phase nickel silicide gate ($Ni_2Si+NiSi$) 76. The first thermal process 74 is typically performed at a moderate temperature, well below 500 degrees C., in similar fashion to conventional salicide processing (e.g., the first thermal anneal process 24 of FIG. 1C).

Figure 2C:
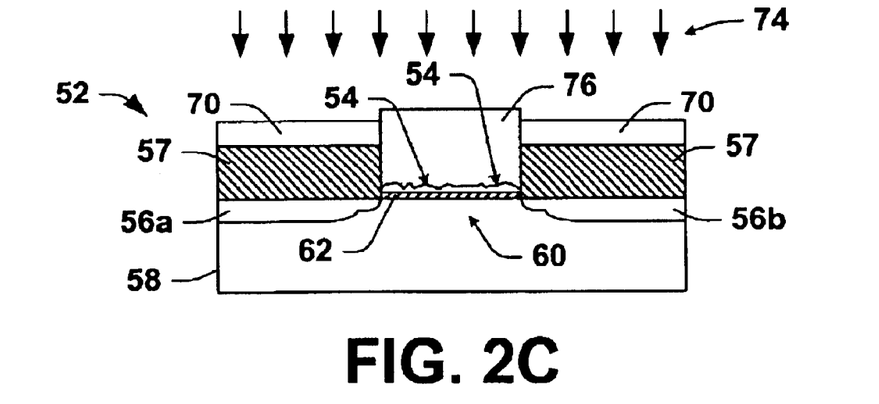
Figure 2D:
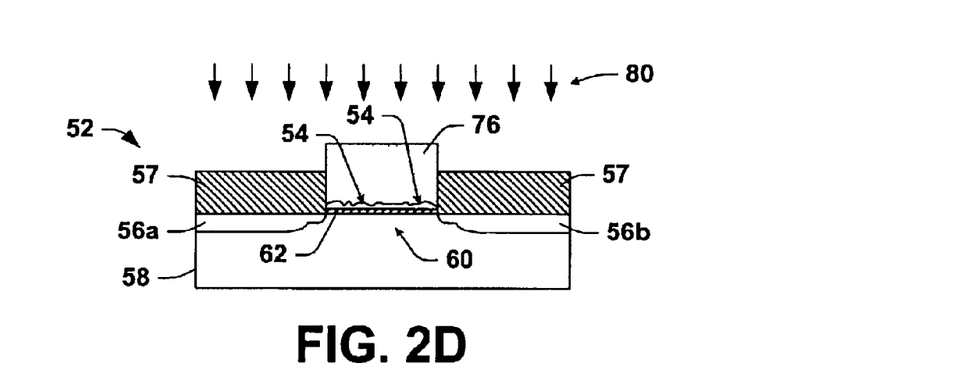

However, the relatively low temperature used in the first thermal process 74 has been found by the inventors to leave unreacted polysilicon portions 54 at the bottom gate surface above the gate oxide 62, as illustrated in FIG. 2C. This irregular interface between the silicide/polysilicon gate 76/54 and the gate oxide 62 results in a non-uniform gate work function for the device 52, which is deleterious to device performance. In FIG. 2D, the remaining nickel 70 is removed using an etch process 80, and a second thermal process 82 is employed in FIG. 2E to transform the first phase silicide 76 into second phase nickel silicide (NiSi) 76'.

Figure 2E:
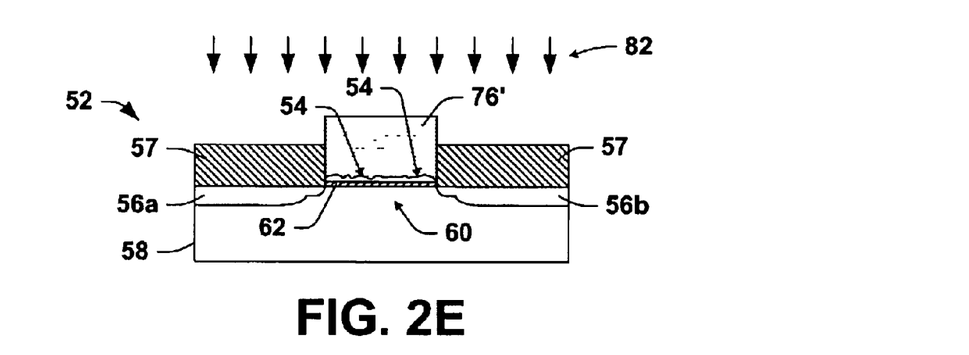

The second thermal process 82 is typically done at a higher temperature than the first process 74 so as to transform the silicide from relatively higher resistance first phase material (e.g., $Ni_2Si+NiSi$) into lower resistance second phase silicide (e.g., NiSi).

Figure 2F:
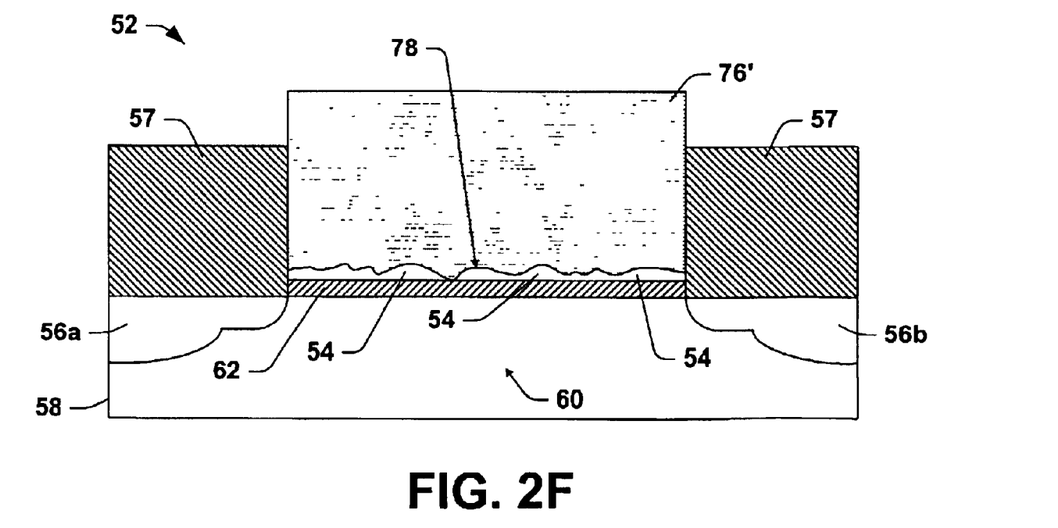

However, because the nickel has already been removed, the second thermal process 82 results in silicide phase transformation without forming any new silicide. As a result, the second phase silicide 76' also has a rough or irregular bottom surface 78, as shown in FIG. 2F. Thus, while efforts such as these to silicide the entire polysilicon gate have been for the purpose of reducing the gate work function by consumption of the polysilicon material 54, in operation, the three step silicide process (e.g., heat-etch-heat) of FIGS. 2A–2F provides less than optimal reduction in the work function, and moreover may reduce the repeatability of the gate performance due to the irregularities at the bottom surface 78 of the gate. In this regard, the relatively low temperature of the first anneal 74 in FIG. 2C is roughly commensurate with salicide processing, wherein the low temperature prevents the polysilicon 54 from acting as a diffusion species and the associated risk of bridging or shorts between the gate and the source/drain regions 56.

However, the inventors have appreciated that in the case of metal silicide gate formation, a silicide process targeted to the gate only, may be used. For example, as illustrated below, coverage of the source/drain regions during gate silicide thermal processing reduces the likelihood of such bridging. The inventors have further found that employing a higher temperature, single-step RTA facilitates more complete reaction and consumption of polysilicon, so as to avoid or mitigate the non-uniformity at the surface 78, and to also provide phase two (e.g., low resistance) silicide material. Thus, the invention facilitates the advantages of metal silicide gate structures, while at the same time reducing or mitigating the work function non-uniformity found in the example of FIGS. 2E and 2F. Consequently, whereas separate silicide operations may be used to provide silicide metal gate formation as well as source/drain silicide contacts, the invention may improve device performance via the single-step RTA in the formation of the metal silicide gate.

One exemplary implementation of the invention is illustrated and described hereinafter in the context of a second phase cobalt silicide ($CoSi_2$) gate formed by reacting a polysilicon gate structure with an overlying cobalt metal layer. Alternatively, a second phase nickel silicide (NiSi) gate may be formed by reacting a polysilicon gate structure with an overlying nickel metal layer using a single-step RTA process. However, it will be appreciated that other materials may be employed in practicing the various aspects of the invention, and that the invention is not limited to the specific implementations illustrated and described herein. Moreover, it is noted that the structures illustrated and described hereinafter are not necessarily drawn to scale.

Figure 3:
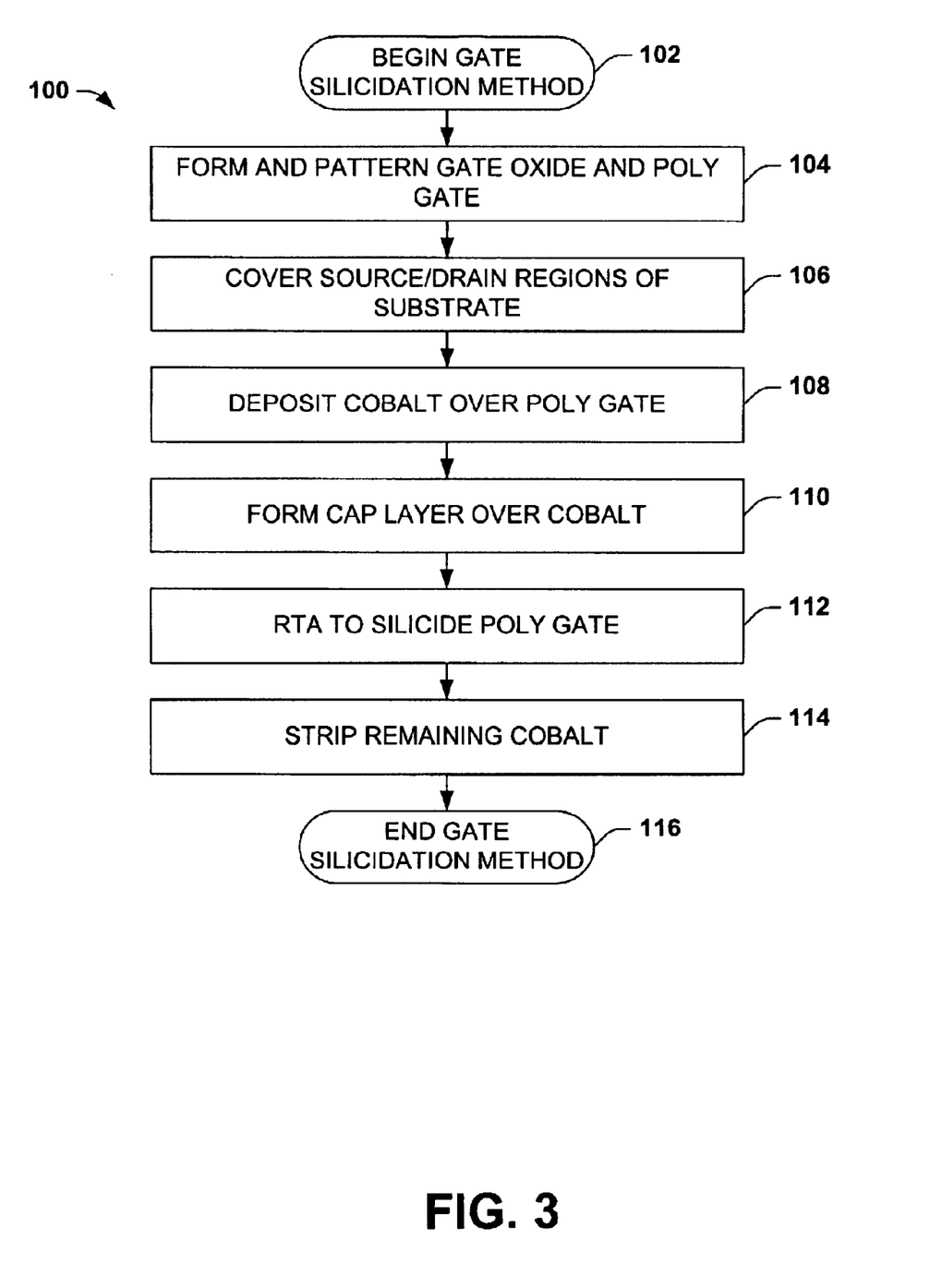
FIG. 3 is a flow diagram illustrating an exemplary method of fabricating transistor gates in accordance with an aspect of the present invention.

In FIG. 3, an exemplary method 100 is illustrated for fabricating a transistor gate in accordance with the invention, which may be employed in fabricating an exemplary transistor 202 illustrated in FIGS. 4A–4F or other devices not illustrated herein. Although the method 100 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of the devices and structures illustrated and described herein as well as in association with other structures not illustrated.

Beginning at 102 in FIG. 3, the exemplary method 100 comprises forming and patterning a gate oxide and a polysilicon gate over a channel region of a substrate at 104 and covering the source/drain regions at 106, wherein the polysilicon gate extends between a bottom surface overlying the gate oxide and a top surface. The source/drain regions are covered at 106 to prevent silicidation while performing subsequent anneal processing at 112, although any technique may be used to prevent silicidation of the source/drain regions during gate silicide processing in accordance with the invention. A layer of cobalt or other metal (e.g., nickel) is then deposited over the top surface of the polysilicon gate at 108 (e.g., not contacting the source/drain regions of the substrate), wherein the invention may be employed in association with cobalt, nickel, or any other metal that forms an intermetallic compound with silicon, but which does not react with silicon oxides, nitrides, or oxynitrides under normal processing conditions. Any appropriate deposition process may be used at 108 to deposit the cobalt, such as sputtering or equivalent techniques as are known.

The metal layer is deposited at 108 such that a portion thereof overlies the top surface of the polysilicon gate, wherein the remainder of the metal layer may overlie a cover layer over the source/drain regions and other structures on the wafer surface. In one exemplary implementation illustrated and described below with respect to FIGS. 4A–4F, the cobalt is deposited to a thickness of about 250–350 Å for a polysilicon thickness of 1000 to 2000 Å. In addition, where the metal is formed of cobalt at 108, an optional cap layer may be formed over the cobalt metal layer at 110, such as Ti, TiN, or equivalent, so as to getter oxygen while performing subsequent thermal annealing, which prevents oxygen from affecting the silicidation reaction. In the illustrated example, the cap layer is deposited to a thickness of about 100–300 Å at 110. However, as noted above and discussed in greater detail below, the invention is not limited to cobalt metal layers, and nickel and other metals are contemplated as falling within the scope of the present invention, wherein a cap layer may, but need not, be formed at 110, depending upon the metal layer material being employed at 108.

At 112, an anneal is performed to react the gate polysilicon with the metal layer to form a conductive second phase metal silicide gate. In the illustrated example, the single-step anneal at 112 involves a rapid thermal anneal (RTA) process consuming substantially all of the gate polysilicon, such that the resulting phase two cobalt silicide (e.g. $Co_2Si$) extends from the bottom surface (e.g., above the gate oxide), to the top surface of the gate structure, leaving the metal silicide gate substantially free of polysilicon. While some residual polysilicon may remain in certain implementations of the invention, the single-step RTA process at 112 has been found to significantly improve the work function uniformity by reducing the interface roughness produced by prior techniques (e.g., FIGS. 2E and 2F above). In this manner, the RTA at 112 provides a uniform interface and hence a uniform work function where the metal silicide gate meets the gate oxide, as illustrated and described further below with respect to FIGS. 4A–4F. The remaining cobalt is thereafter removed at 114 using a wet chemical etch or stripping operation, before the exemplary gate silicide process 100 ends at 116.

The inventors have appreciated that the single-step RTA provides significant performance advantages over the conventional techniques involving first and second anneals with intervening etching to remove remaining metal. In the illustrated example using cobalt, the RTA is performed at 112 at a temperature of about 500 degrees C. or more and about 800 C. or less, such as between about 500 and 750 degrees C., preferably about 700 degrees C. for 10 to 60 seconds in an $N_2$ atmosphere. For a polysilicon gate thickness of 1000 to 2000 Å, a cobalt layer thickness of about 250 to 350 Å is deposited at 108 over the gate polysilicon, and a Ti or TiN cap layer is deposited at 110 to a thickness of about 100 to 300 Å.

In another exemplary implementation of the invention, nickel can be employed as the metal layer formed at 108 and reacted at 112 with the polysilicon to form a second phase silicide NiSi. In this example, a layer of nickel is deposited over the gate polysilicon at 108 to a thickness of about 250 to 350 Å (e.g., for a polysilicon thickness of 1000 to 2000 Å), wherein no cap layer is needed. The single-step anneal in this case comprises performing a rapid thermal anneal at about 500 degrees C. or more in an atmosphere comprising $N_2$ for about 10 seconds or more and about 60 seconds or less, such as about 30–60 seconds, to provide a substantially uniform work function at the bottom surface of the gate. The inventors have found this alternative particularly effective at a temperature between about 500 and 600 degrees C., such as about 550 degrees C., so as to react all or substantially all the polysilicon with the portion of the nickel layer to form the metal silicide gate comprising NiSi generally extending from the bottom surface to the top surface of the gate.

As with the cobalt case described above, a portion of the substrate overlying the transistor source/drain regions are advantageously covered prior to forming the nickel layer to prevent silicidation of the covered portion of the substrate while performing the anneal. In this manner, the invention provides a metal silicide gate comprising phase two nickel silicide (NiSi) substantially free of polysilicon at the bottom surface of the gate. Separate process steps may be carried out to form silicide contacts for the source drain regions, either before or after the metal silicide gate processing (e.g., method 100) of the invention.

Other metals may be used in accordance with the various aspects of the invention, including but not limited to nickel and cobalt, wherein a cap layer may be provided at 110 as needed to getter oxygen in the RTA processing at 112. For example, the invention may be implemented in association with any metal which forms an intermetallic compound with silicon, but which does not react with silicon oxides, nitrides, or oxynitrides during processing. In this manner, the single-step RTA silicide processing of the invention provides for consumption of substantially all the gate polysilicon and transformation thereof into the lower resistance second phase silicide (e.g., NiSi, $CoSi_2$, etc.), resulting in a substantially uniform interface work function for the finished metal silicide gate.

Figure 4A:
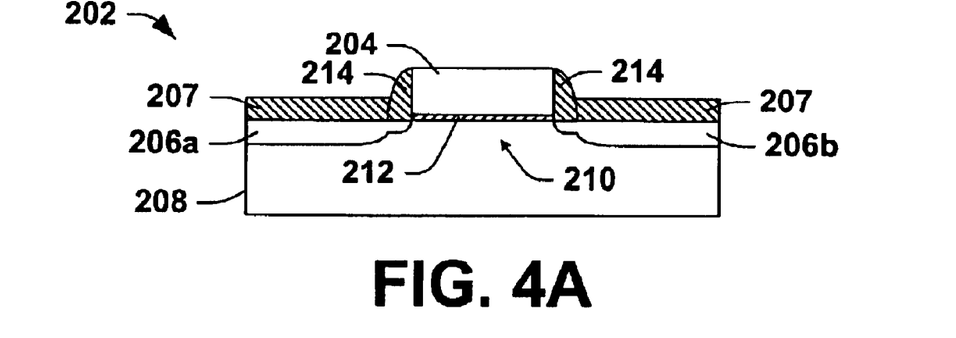
FIGS. 4A–4F are partial side elevation views in section illustrating an exemplary metal silicide transistor gate fabricated in accordance with the invention.

Referring also to FIGS. 4A–4F, an exemplary transistor 202 is illustrated having a polysilicon gate structure silicided in accordance with the present invention. In the illustrated device 202, cobalt is used for the silicidation. However, it will be appreciated that nickel or other metal material could alternatively be used within the scope of the invention. As illustrated in FIG. 4A, the transistor 202 comprises a polysilicon gate 204 and source/drain regions 206a and 206b laterally spaced in a substrate 208 to define a channel region 210 therebetween, over which a thin gate oxide 212 is formed. The polysilicon gate structure 204 is formed over the gate oxide 212 to a thickness of about 1000 to 2000 Å, and sidewall spacers 214 are formed on the lateral sides of the gate 204 and gate oxide 212.

Figure 4B:
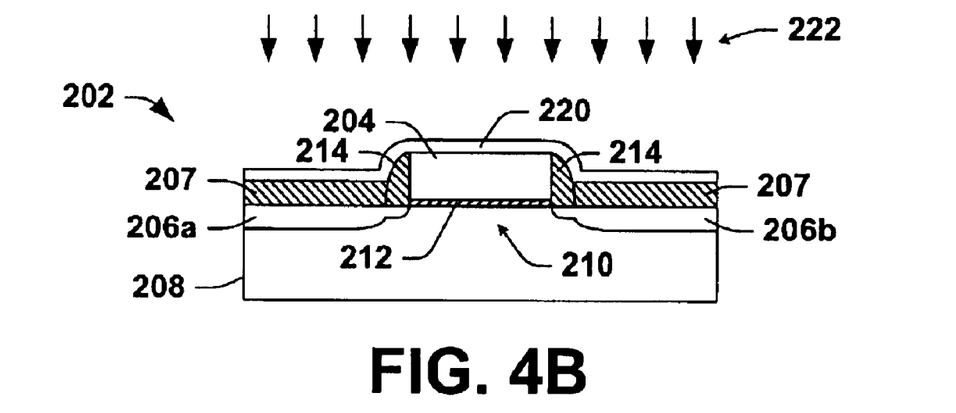
Figure 4C:
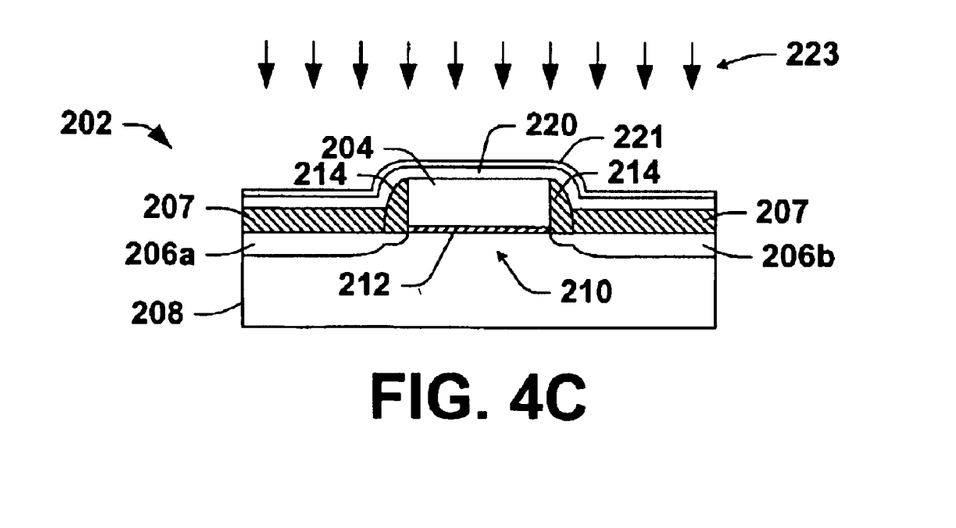

The source/drain regions 206 are covered with a nitride layer 207 (e.g., step 106 of method 100 in FIG. 3), which may, but need not be the same material as the sidewall spacers 214. Alternatively, a single cover layer 207 could be employed without separate formation of the sidewall spacers 214 at this point in the process flow. In this regard, dopants may be provided to define the source/drain regions 206a and 206b (e.g., via diffusion and/or implantation) either prior to the gate silicide processing as illustrated in FIGS. 4A–4F, or subsequently. In FIG. 4B, a cobalt layer 220 is formed over the device 202 via a deposition process 222 (e.g., step 108 in FIG. 3) to a thickness of about 250 to 350 Å. A Ti or TiN cap layer 221 is deposited in FIG. 4C to a thickness of about 100 to 300 Å using a deposition process 223 (e.g., step 110 of the method 100) to getter oxygen in the subsequent single-step RTA, thereby preventing oxygen from affecting the silicidation reaction.

Figure 4D:
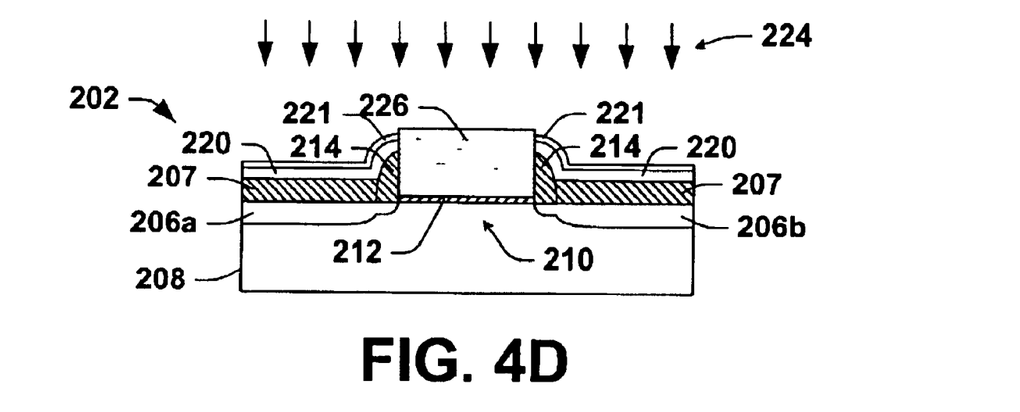
Figure 4E:
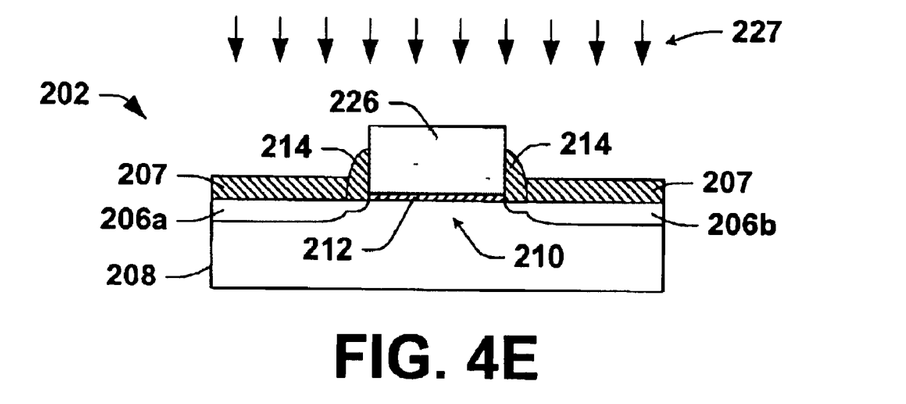
Figure 4F:
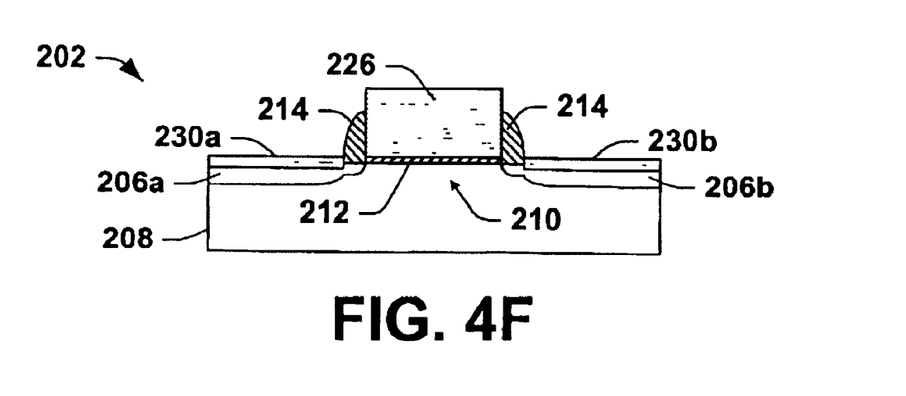

In FIG. 4D, a single-step rapid thermal anneal process 224 is employed (e.g., step 112 of method 100) to react the gate polysilicon 204 with the cobalt layer 220, consuming substantially all of the polysilicon 204 in forming a second phase metal silicide gate 226, as well as some or all of the gettering cap layer 221. During the gate silicide thermal process 224, the source/drain regions 206a and 206b remain covered with the nitride cover layer 207. In FIG. 4E, the unreacted cobalt 220 and any remaining cap layer material 221 are removed using a wet etch process 227 (e.g., step 114 of method 100). Thereafter, the cover layer 207 is removed, and source drain silicide contacts 230a and 230b are formed over the source/drain regions 206a and 206b, respectively, as illustrated in FIG. 4F. Further metalization processing (not shown) may then be performed to provide multi-level interconnect structures to complete fabrication of a finished semiconductor device using known processing techniques.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of fabricating a transistor gate in a semiconductor device, comprising:
   forming a gate oxide layer over a channel region of a substrate;
   forming and patterning a polysilicon gate over the channel region, the polysilicon gate extending between a bottom surface overlying the gate oxide and a top surface;
   forming a metal layer over the substrate, at least a portion of the metal layer overlying the top surface of the polysilicon gate, wherein the metal layer does not contact a source/drain region associated with the device; and
   performing a single anneal to react the polysilicon with the portion of the metal layer to form a conductive second phase metal silicide gate extending from the bottom surface to the top surface,
   wherein forming the metal layer comprises forming a cobalt layer overlying the top surface of the polysilicon gate, and
   wherein forming the cobalt layer comprises depositing cobalt over the top surface of the polysilicon gate to a thickness of about 250 Å or more and about 350 Å or less, and wherein performing the anneal comprises performing the rapid thermal anneal at a temperature of about 700 degrees C. in an atmosphere comprising $N_2$ for about 10 seconds or more and about 60 seconds or less to provide a substantially uniform work function at the bottom surface of the gate, and
   further comprising covering a portion of the substrate overlying at least one source/drain region prior to forming the cobalt layer to prevent silicidation of the covered portion of the substrate while performing the anneal.

2. The method of claim 1, further comprising removing unreacted metal after performing the anneal.

3. A method of fabricating a transistor gate in a semiconductor device, comprising:
   forming a gate oxide layer over a channel region of a substrate;
   forming and patterning a polysilicon gate over the channel region, the polysilicon gate extending between a bottom surface overlying the gate oxide and a top surface;
   forming a metal layer over the substrate, at least a portion of the metal layer overlying the top surface of the polysilicon gate, wherein the metal layer does not contact a source/drain region associated with the device; and
   performing a single anneal to react the polysilicon with the portion of the metal layer to form a conductive second phase metal silicide gate extending from the bottom surface to the top surface,
   wherein forming the metal layer comprises forming a cobalt layer overlying the top surface of the polysilicon gate, and
   wherein forming the cobalt layer comprises depositing cobalt over the top surface of the polysilicon gate to a thickness of about 250 Å or more and about 350 Å or less, and wherein performing the anneal comprises performing the rapid thermal anneal at a temperature of about 700 degrees C. in an atmosphere comprising $N_2$ for about 10 seconds or more and about 60 seconds or less to provide a substantially uniform work function at the bottom surface of the gate, and
   further comprising forming a cap layer comprising one of Ti and TiN over the cobalt layer to getter oxygen while performing the rapid thermal anneal.

4. A method of fabricating a transistor gate in a semiconductor device, comprising:
   forming a gate oxide layer over a channel region of a substrate;
   forming and patterning a polysilicon gate over the channel region, the polysilicon gate extending between a bottom surface overlying the gate oxide and a top surface;
   forming a metal layer over the substrate, at least a portion of the metal layer overlying the top surface of the polysilicon gate, wherein the metal layer does not contact a source/drain region associated with the device; and performing a single anneal to react the polysilicon with the portion of the metal layer to form a conductive second phase metal silicide gate extending from the bottom surface to the top surface, wherein forming the metal layer comprises forming a nickel layer overlying the top surface of the polysilicon gate, and wherein performing the anneal comprises performing a rapid thermal anneal at a temperature of about 500 degrees C. or more, and wherein performing the anneal comprises reacting substantially all the polysilicon with the portion of the nickel layer to form the metal silicide gate comprising NiSi extending from the bottom surface to the top surface of the gate, further comprising covering a portion of the substrate overlying at least one source/drain region prior to forming the nickel layer to prevent silicidation of the covered portion of the substrate while performing the anneal.

5. The method of claim 4, wherein forming the nickel layer comprises depositing nickel over the top surface of the polysilicon gate to a thickness of about 250 Å or more and about 350 Å or less, and wherein performing the anneal comprises performing the rapid thermal anneal in an atmosphere comprising $N_2$ for about 30 seconds or more and about 60 seconds or less to provide a substantially uniform work function at the bottom surface of the gate.

* * * * *